United States Patent [19]
Lin et al.

[11] Patent Number: 6,004,845
[45] Date of Patent: Dec. 21, 1999

[54] METHOD FOR FABRICATING A CROWN-SHAPED CAPACITOR

[75] Inventors: Benjamin Szu-Min Lin, Chiayi; Der-Yuan Wu, Hsinchu, both of Taiwan

[73] Assignee: United Microelectronics Corp., Taipei, Taiwan

[21] Appl. No.: 09/111,306

[22] Filed: Jul. 7, 1998

[30] Foreign Application Priority Data

Mar. 11, 1998 [TW] Taiwan ................................. 87103551

[51] Int. Cl.[6] ................................................. H01L 21/8242
[52] U.S. Cl. ............................................ 438/253; 438/396
[58] Field of Search ................................... 438/253, 254, 438/255, 256, 396, 397, 398, 399; 430/5

[56] References Cited

U.S. PATENT DOCUMENTS

| | | | |
|---|---|---|---|
| 5,700,731 | 12/1997 | Lin et al. ............................... | 438/254 |
| 5,821,013 | 10/1998 | Miller et al. ............................ | 430/5 |
| 5,902,126 | 5/1999 | Hong et al. ............................. | 438/253 |
| 5,914,202 | 6/1999 | Nguyen et al. .......................... | 430/5 |
| 5,946,571 | 8/1999 | Hsue et al. .............................. | 438/253 |

*Primary Examiner*—Tuan H. Nguyen
*Attorney, Agent, or Firm*—Thomas, Kayden, Horstemeyer & Risley

[57] ABSTRACT

A method for fabricating crown-shaped a capacitor is provided. The method is comprised of the following steps. First, a dielectric layer is formed on a substrate having a preformed field effect transistor, then a contact hole which exposes one of the source/drain regions of the field effect transistor is defined and formed. Then a first conductive layer is formed in the contact hole and on the dielectric layer, a crown-shaped photoresist layer is formed by employing a mask comprising a transmission layer, a partial transmission layer, and a non-transmission layer. Next, the pattern on the photoresist layer is transferred onto the first conductive layer to form a crown-shaped conductive layer. Then, a dielectric film is formed on the top of the crown-shaped conductive layer, and a second conductive layer on the top of the dielectric film.

39 Claims, 8 Drawing Sheets

METHOD FOR FABRICATING A CROWN-SHAPED CAPACITOR

CROSS-REFERENCE TO RELATED APPLICATION

This application claims the priority benefit of Taiwan application serial no. 87103551, filed Mar. 11, 1998, the full disclosure of which is incorporated herein by reference.

BACKGROUND OF THE INVENTION

1. Field of the Invention

This invention relates to a method for fabricating capacitors, and more particularly, to a method for fabricating crown-shape capacitors by using partial transmission masks. The method begins by using a partial transmission mask, which contains a partial transmission layer, to form a crown-shaped photoresist, then transfers the pattern of the photoresist onto the crown-shaped lower electrode in a capacitor. The method is designed to fabricate crown-shaped capacitors which have larger surface areas than those of stacked capacitors, in order to improve the capacitance of a capacitor.

2. Description of Related Art

Recently, industry has attempted to raise the storage densities of integrated-circuit memories, in order to increase the amount of data that can be saved in a single chip. The cost of every bit of data stored in high-density memory, which is more integrated, is less than the cost of saving the same data in the lower density memory of prior art, which is less integrated. High-density memory provides a higher storage density, which improves efficiency. A conventional method for improving the integration of an integrated circuit is to downsize part of the circuit structure, such as wiring lines, and transistor gates, and shorten the separation between devices. Downsizing part of the circuit structure normally indicates downsizing the design rules for fabricating integrated circuit devices.

A conventional data storage method for DRAM is to selectively charge and discharge each of a series of capacitors formed on the surface of the semiconductor substrate, wherein the charging state corresponds to logic 1 and the discharging state corresponds to logic 0, or vice versa. The amount of charges stored in a capacitor depends on the surface area of the electrodes of the capacitor. The reading and writing operations of a memory cell are processed by selectively connecting the capacitor to a bit line by using a field effect transistor (FET), and then having charges transferred into or retrieved from the capacitor. A contact is placed between the bit line and the FET to link one of the source/drain electrodes of the FET and the bit line while the capacitor makes contact with the other electrode of the FET. The gate of the FET provides the signal in the word line. Connecting the FET and the lower electrode of the capacitor facilitates the transfer of charges between the bit line and the capacitor.

Applying the downsized design rules to DRAM decreases the substrate surface area provided for forming capacitor surfaces of a DRAM. Furthermore, applying the downsized design rules to the conventional, 2-dimentional design of the capacitor reduces the number of charges that can be stored in a capacitor, i.e. static permittivity. Reducing the permittivity leads to several problems including loss of stored information, because the capacitor is very sensitive to decay mechanisms and charge leakage. Sensitivity to charge leakage results in a DRAM needing a faster refresh rate, which causes another problem in that the memory cell cannot store or retrieve information while the memory cell is being refreshed. Therefore, reducing the permittivity requires either a more complicated design for reading and retrieving information or more sensitive signal amplifiers. Furthermore, the newest DRAM designs require higher permittivity from the tiny surface of a DRAM cell.

Conventionally, the DRAM fabrication process for a capacity less than 1 MB ($10^6$ bytes) normally uses 2-dimensional capacitors or so-called planar-type capacitors. Since the planar-type capacitor requires a relatively large area on the substrate for storing charges, it is not suitable for a more highly integrated design. For a more highly integrated DRAM having a capacity of 4 MB or greater, a 3-dimensional capacitor such as a stacked-type capacitor is required.

Compared with the planar-type capacitor, a stacked-type capacitor has a relatively high permittivity because the size of the memory cell has been further reduced. However, as the integration of a DRAM towards a DRAM with a capacity of 64 MB, a simple 3-dimensional capacitor can no longer meet the demands placed on it.

One solution is to horizontally extend and stack the electrodes and the dielectric layer of a capacitor to form a fin-type stacked capacitor that increases permittivity by increasing the surface of the capacitor. Information related to forming a fin-type capacity can be found in "3-Dimensional Stacked Capacitor Cell for 16M and 64M DRAMs" [International Electron Devices Meeting, pp592–595, December 1988] by Ema, U.S. Pat. Nos. 5071783, 5126810, and 5206787.

Another solution is to vertically extend the electrodes and dielectric layer of a capacitor to form a so-called crown-shaped capacitor that increases permittivity by increasing the surface area of the capacitor.

A conventional method for fabricating crown-shape capacitor is shown in FIGS. 1A through 1H.

Referring to FIG. 1A, first a FET 102 is formed on the substrate 100, wherein the FET includes a gate 104 and source/drain regions 106 which are formed on the active area of the substrate, and are isolated by field oxide 101. Then, a dielectric layer 108, an etching stop layer 110 and a dielectric layer 118 are formed in sequence on the substrate 100. Chemical vapor deposition (CVD) or borophosphosilicate glass (BPSG) can be employed to deposit a SiO2 layer on the tops of the substrate 100 and etching stop layer 110 with the result that dielectric layers 108 and 118 both include $SiO_2$ layers. Etching stop layer 110 includes silicon nitride, which can be formed by employing CVD to deposit a silicon nitride layer on the top of the dielectric layer 108. Then, a photoresist layer 120 is coated on top of dielectric layer 118, and shaped into a defined photoresist layer by employing a photolithography process, wherein the defined photoresist 120 is used to define an area in which the deep pattern is formed.

Referring next to FIG. 1B, the dielectric layer 118a, etching stop layer 110a, and dielectric layer 108a are etched through in sequence by utilizing the photoresist layer 120 as a mask. Because oxide and nitride have nearly identical etching rates, a low selectivity etching process on oxide and nitride is used. A deep opening 121 is formed in the dielectric layer 108a, the etching stop layer 110a, and the dielectric layer 118a in order to expose one of the source/drain regions 106 underneath. Since the high aspect ratio is high, deviation is likely to happen in the etching process, and the etching depth is difficult to control. Furthermore, although a prolonged etching period is necessary in order to etch through the thick dielectric layer, serious damage to photoresist layer 120 results, which decreases the latter's efficiency as an etching stop. This decreases device yield.

Referring to FIG. 1C, another photoresist layer 130 is formed to define the desired shallow patterns after the photoresist layer is removed, wherein the photoresist layer 130 exposes the previously formed deep opening 121, and the shallow pattern has a larger horizontal dimension than that of the deep pattern.

Referring next to FIG. 1D, an opening 121b with a large horizontal dimension is formed on the dielectric layer 118b above the etching stop layer 110a by performing a dry etching process with a high etching selectivity process on oxide and nitride, and using the photoresist layer 130 as the etching mask. During the shallow etching process, the previously formed deep opening 121 is also etched, as a result, the opening 121a is over-etched, furthermore, the conductivity of the device is impaired by the damage to the source/drain regions 106 due to etching.

Referring to FIG. 1E, the photoresist 130 is then removed.

Referring next to FIG. 1F, a conductive layer 122 is formed on the substrate 100. The opening 121a is filled up with the same conductive material forming the conductive layer 122, the surface 127 of the larger opening 121b is covered by the conductive material as well. The conductive material used in this step includes polysilicon. Generally, dopants are implanted into polysilicon for increasing the conductivity.

Referring to FIG. 1G, a planarization process is performed using, for example, chemical-mechanical polishing on the conductive layer 122 to expose the surface of the dielectric layer 118b. Then, the dielectric layer 118b is removed to expose the profile of a lower electrode 122a of a capacitor.

Referring next to FIG. 1H, a dielectric film 124 is formed on the surface of the lower electrode 122a, thereafter, the dielectric film 124 is covered by a conductive layer 132 in order to construct an upper electrode of a capacitor.

Because the conventional method for fabricating the crown-shaped capacitors of a DRAM is very complicated, it is both time-consuming and costly.

SUMMARY OF THE INVENTION

It is therefore an objective of the present invention to provide a method for fabricating crown-shaped capacitors of a DRAM by employing a partial transmission mask. The method performs only one photolithography process after the formation of the contact used to form a crown-shaped photoresist that is in turn used to define the crown-shaped capacitor. Furthermore, this method can fabricate crown-shaped capacitors with larger surface areas which improves the permittivity of the capacitors.

In accordance with the foregoing and other objectives of the present invention, the method for fabricating crown-shaped capacitors of a DRAM according to the present invention follows. The method of the present invention includes forming a dielectric layer on a substrate having a field effect transistor. This is followed by defining the dielectric layer used to form a contact opening which exposes one of the source/drain regions of the field effect transistor. Next, a first conductive layer is formed in the contact opening and on the dielectric layer. Thereafter a crown-shaped photoresist layer is formed by employing a mask containing a transmission layer, a partial transmission layer, and a non-transmission layer. Then, the pattern of the photoresist layer is transferred onto the first conductive layer to form a crown-shaped conductive layer. Next, a dielectric layer is formed on the crown-shaped conductive layer; and lastly, a second conductive layer is formed on the dielectric layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for fabricating crown-shaped capacitors. FIGS. 2A through 2F show a preferred embodiment according to the present invention, fabricating crown-shaped capacitors by employing a partial transmission mask.

Figure 1A:
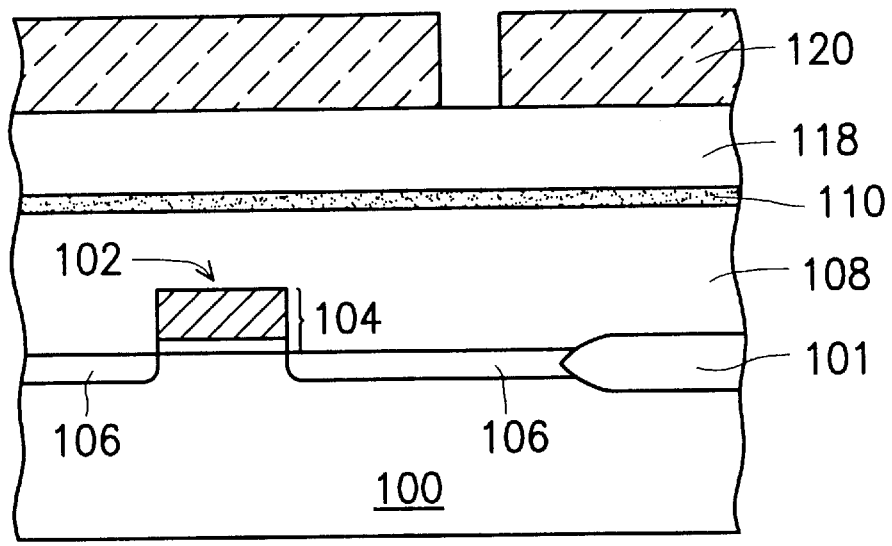
FIGS. 1A through 1H are cross-sectional views showing the conventional steps take to fabricate a crown-shaped capacitor.
Figure 1B:
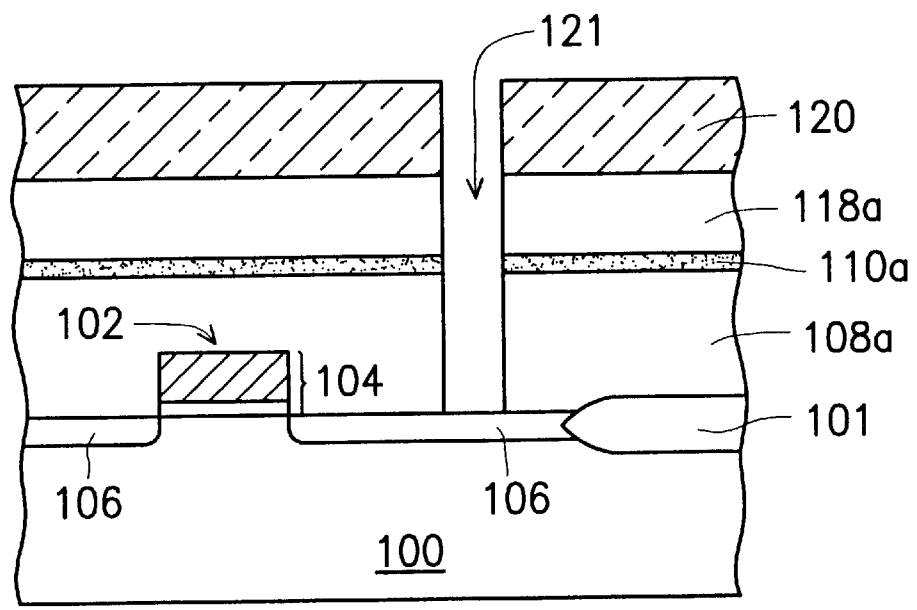
Figure 1C:
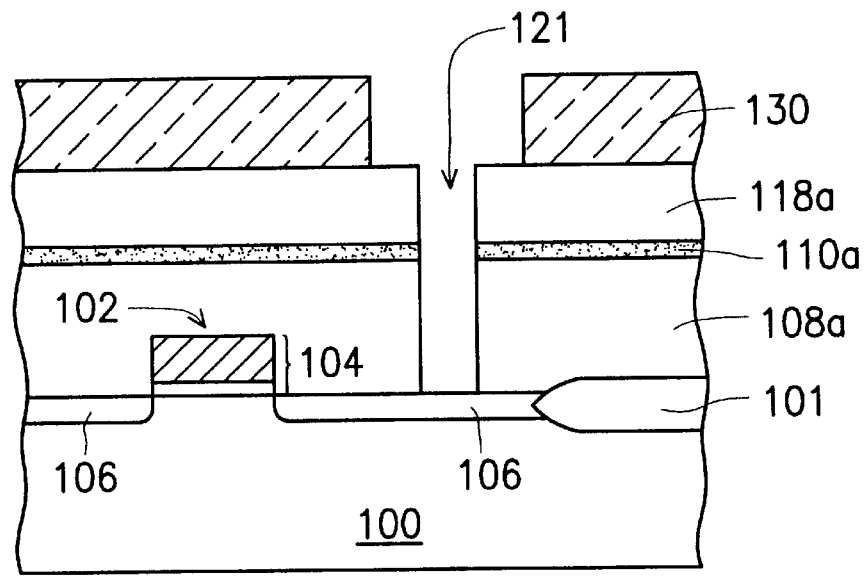
Figure 1D:
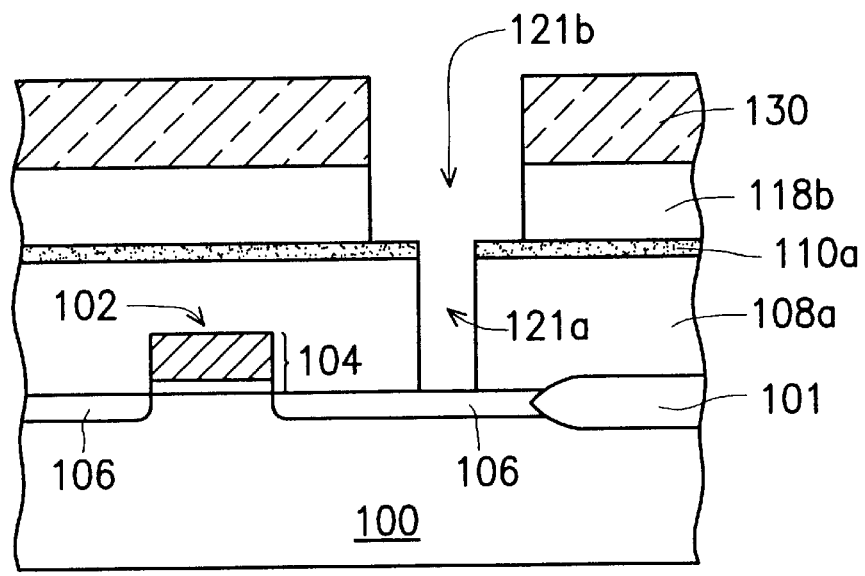
Figure 1E:
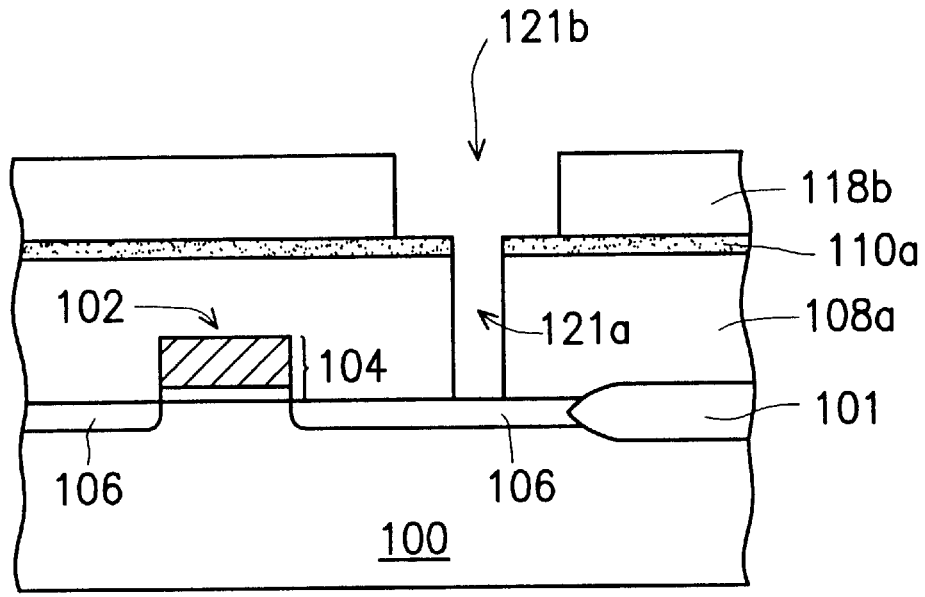
Figure 1F:
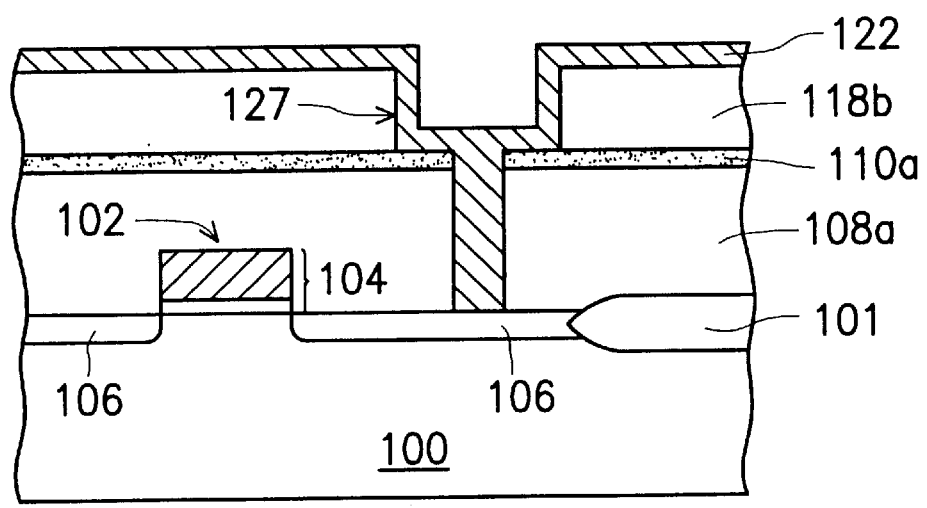
Figure 1G:
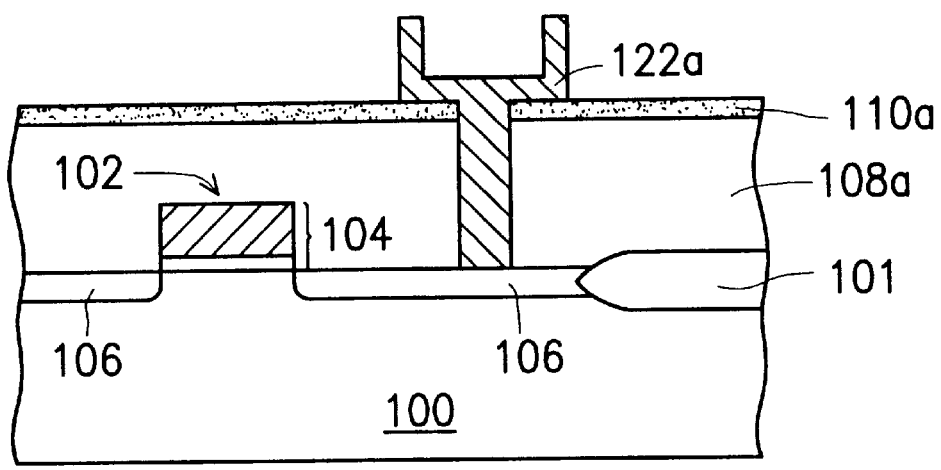
Figure 1H:
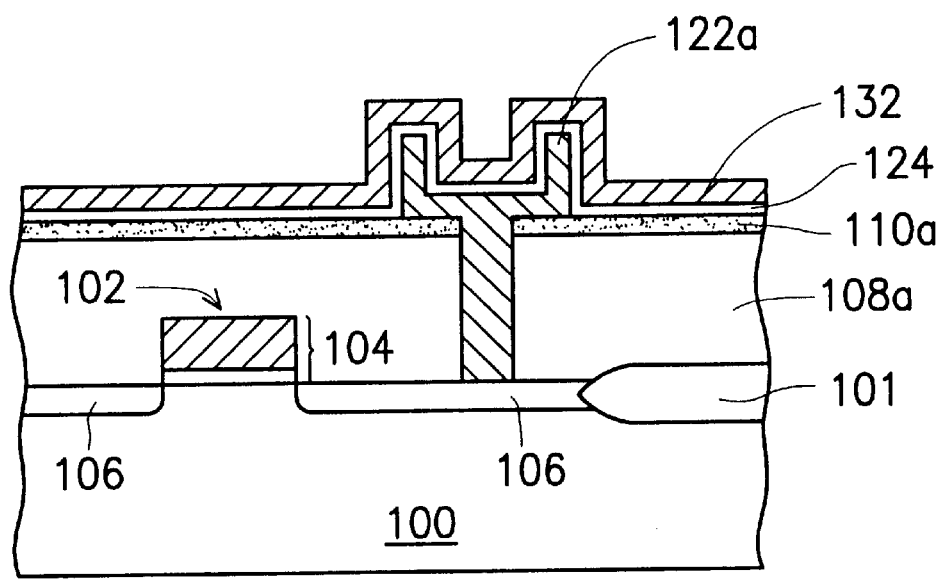
Figure 2A:
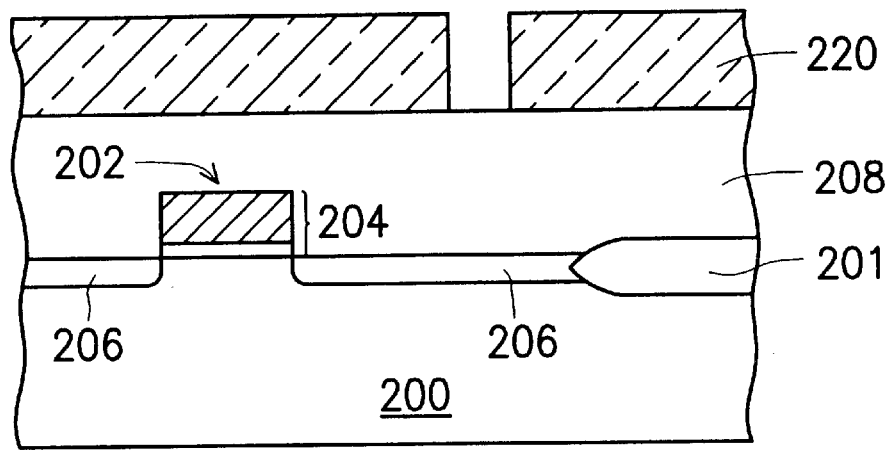
FIGS. 2A through 2F are cross-sectional views showing the steps taken to fabricate a crown-shaped capacitor according to a preferred embodiment of the invention.

Referring to FIG. 2A, a field effect transistor (FET) 202 of a DRAM is formed on a substrate 200, such as a p-type silicon substrate, wherein the FET 202 is comprised of a gate 204 and source/drain regions 206. The FET 202 is formed on the active area of the substrate 200 and is isolated by field oxide 201. Then a dielectric layer 208 including a $SiO_2$ layer or BPSG is formed on the substrate 200 through chemical vapor deposition. Then the dielectric layer 208 is coated by a photoresist material that is later converted into a defined photoresist layer 220 through a photolithography process. The photoresist layer 220 is used to define the area in which the contact is formed.

Figure 2B:
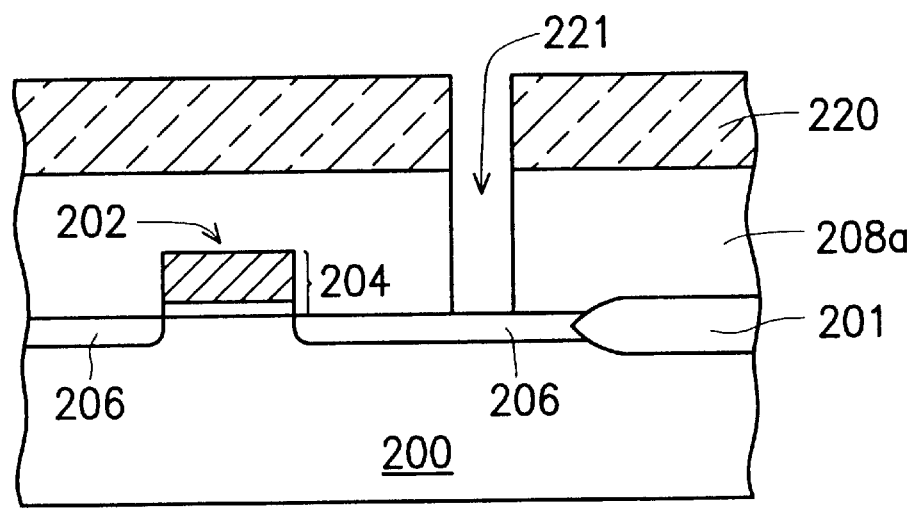

Referring next to FIG. 2B, using photoresist layer 220 as a mask, dielectric layer 208a is etched through to form a contact hole 221 and expose one of the source/drain regions 206.

Figure 2C:
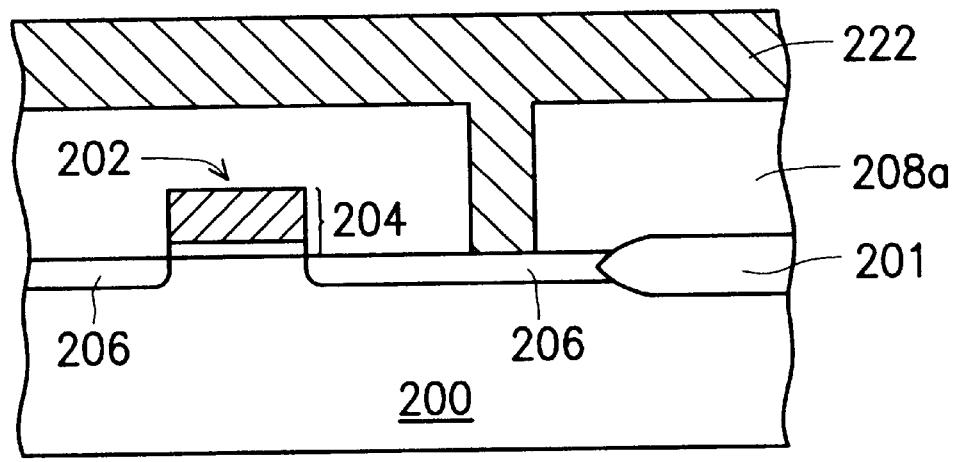

Referring to FIG. 2C, the photoresist layer 220 is removed. Then, a conductive layer 222 is formed on the substrate 200, filling the contact hole as well. Conductive layer 222 includes polysilicon that is normally implanted with dopants for improving conductivity.

Figure 2D:
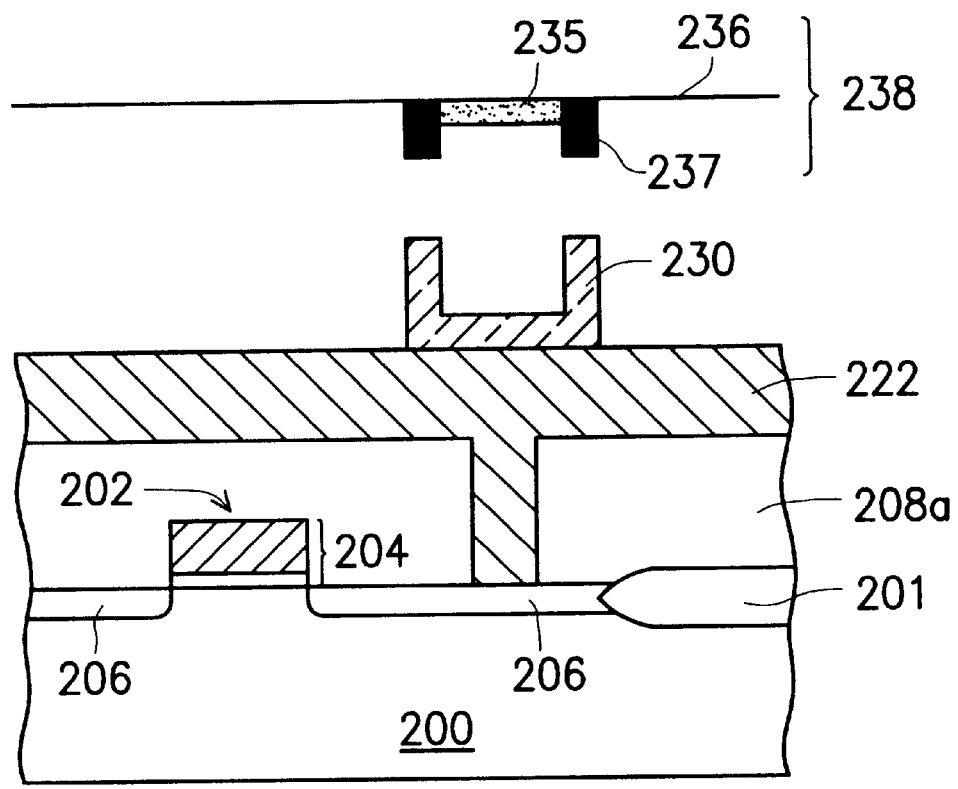

Referring next to FIG. 2D, a crown-shaped photoresist layer 230 is formed by employing a mask 238, which includes a partial transmission layer 235, a transmission layers 236, and a non-transmission layer 237. The non-transmission layer 237 of mask 238 can include a set of chromium layers, and the partial transmission layer 235 of mask 238 can include a chromium oxide layer.

Figure 2E:
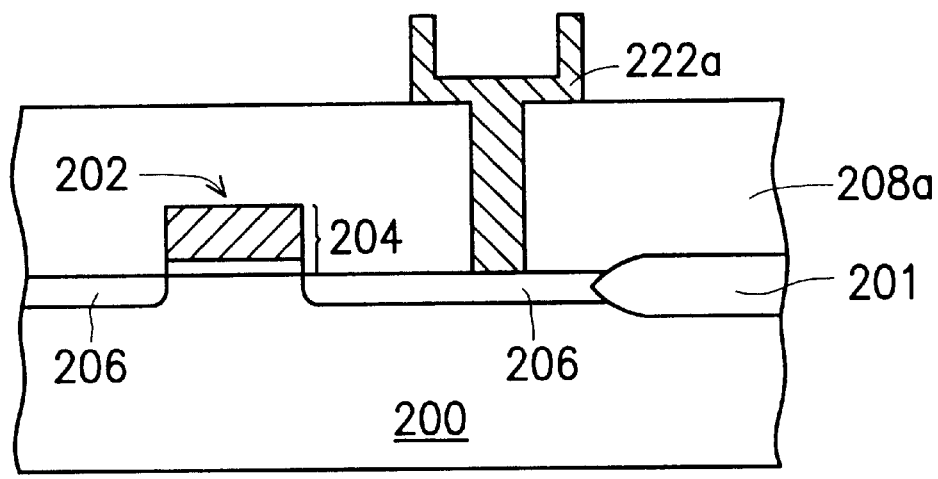

Referring to FIG. 2E, an anisotropic etching process is performed on the conductive layer 222 by using the crown-shaped photoresist layer as a mask for forming a crown-shaped conductive layer 222 which is used as a lower electrode 222a of a capacitor.

Furthermore, because the mask 238 increases the number of contained non-transmission layers, and a partial transmission layer is inserted between each pair of non-transmission layers, the pattern and electrodes of a capacitor are formed as a concentric, multi-cylinder structure. This concentric, multi-cylinder structure is not necessarily circular or square.

Figure 2F:
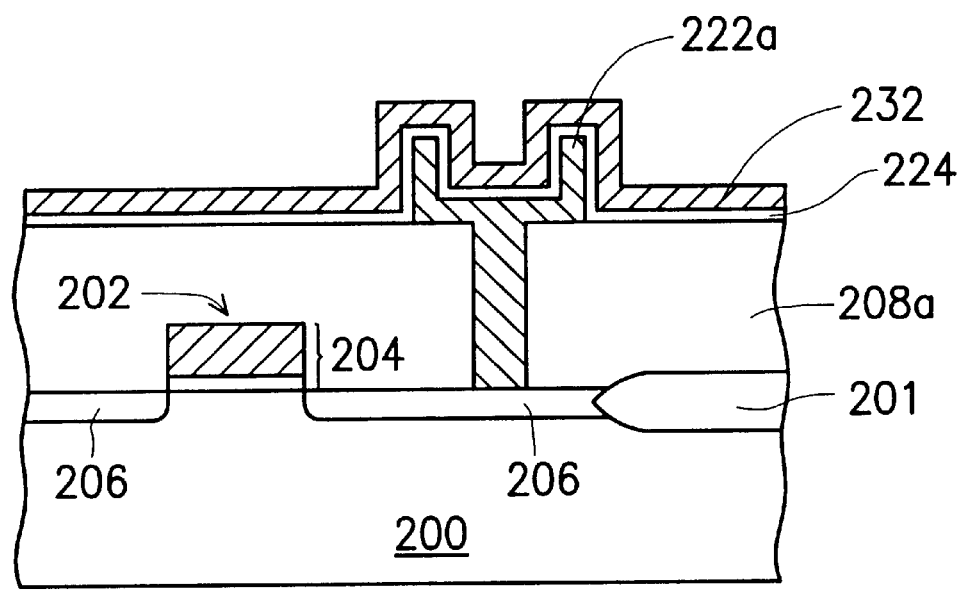

Referring next to FIG. 2F, a dielectric film 224 having a thickness of 10 Å~60 Å is formed on the exposed surface of the lower electrode 222a, wherein the dielectric film includes silicon oxide, silicon nitride/silicon oxide (NO), silicon oxide/silicon nitride/silicon oxide (ONO). $Ta_2O_5$, $Pb(Zr,Ti)O_3$ (PZT), or $(Ba,Sr)TiO_3$ (BST). Then a conductive layer 232 is formed on the surface of the dielectric layer 224, wherein the conductive layer, which includes a metal layer or a polysilicon layer, is an upper electrode of a capacitor. The conductive layer 232 is formed by chemical vapor deposition in order to deposit a layer of polysilicon, then dopants are implanted into the deposited polysilicon to improve its conductivity, wherein the dopants include n-type arsenic ions. The conductive layer 232 can also be formed by depositing a layer of a metal compound such as titanium nitride. Then, the storage capacitor of a DRAM is fabricated using a conventional photolithography and etching processes.

Figure 3A:
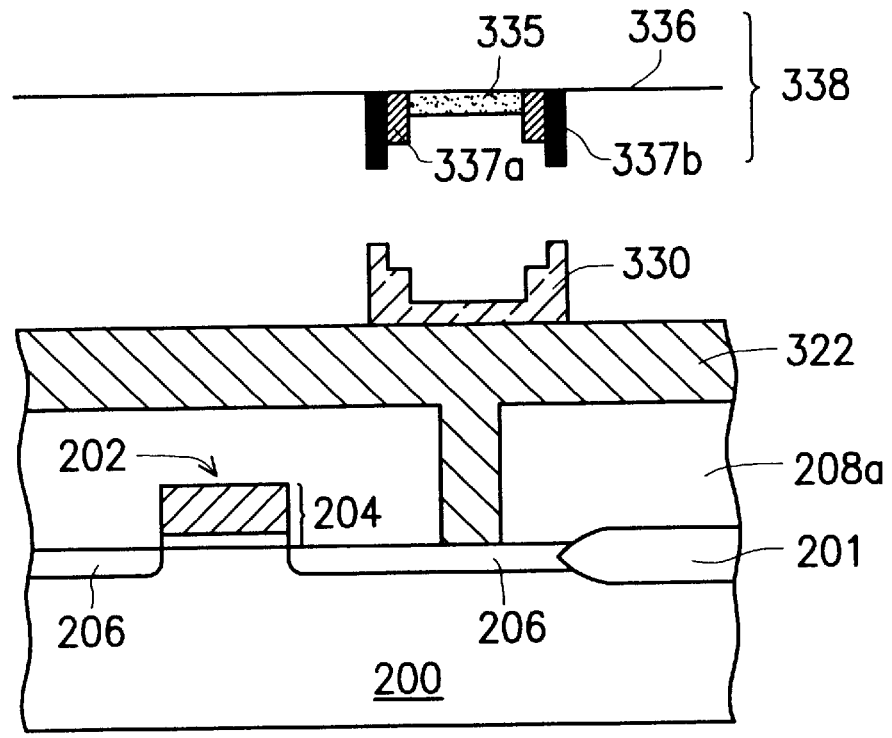
FIGS. 3A and 3B are cross-sectional views showing the steps taken to fabricate a crown-shaped capacitor according to another preferred embodiment of the invention.
Figure 3B:
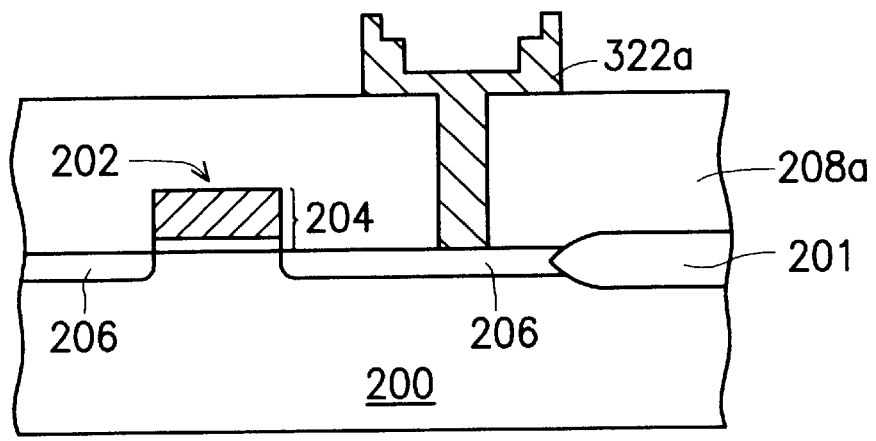

Furthermore, as shown in FIG. 3A, the surface area of the lower electrode in a capacitor can also be enlarged using a photolithography process that utilizes a mask 338 having a multi-step partial transmission layer. A step-like photoresist layer 330, which can be used to fabricate a step-like electrode of a capacitor 322a, as shown in FIG. 3B, is obtained after the photolithography process. The mask 338 has a pattern consisting of portions with a number of different transmission rates, wherein the portion 336 of the mask is fully transmissive, and the portion 335 of the mask is partially transmissive. The region between portions 335 and 336 can be divided into several sections, for example 337a and 337b, and each of these has a different transmission rate, wherein the transmission rates decrease in the direction from 335 toward 336.

In conclusion, the method of fabricating crown-shaped capacitors of a DRAM according to the present invention has the following characteristics:

1. The lower electrode formed by the method according to the present invention is crown-shaped which has a larger surface area than a stacked capacitor, it can therefore improve the capacitor's ability to store charges.

2. The method according to the present invention defines a complicated pattern on a photoresist layer by performing a simple photolithography operation using a mask comprised of a transmission layer, a partial transmission layer, and a non-transmission layer. The defined photoresist layer then has a pattern with multiple thicknesses.

3. The method according to the present invention uses a crown-shaped photoresist, formed by using a partial transmission mask, to fabricate a crown-shaped capacitor, the fabrication of which is simpler and less costly than the conventional method.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a crown-shaped capacitor comprising the steps of:

provided a substrate having a pre-formed field effect transistor, wherein the field effect transistor includes a gate and source/drain regions;

forming a dielectric layer;

defining the dielectric layer to form a contact hole, wherein the contact hole exposes one of the source/drain regions;

forming a first conductive layer in the contact hole and on the dielectric layer;

performing a photolithography operation to form a photoresist layer having a crown-shaped pattern on the first conductive layer, this is accomplished by employing a mask comprised of a transmission layer, a partial transmission layer, and a non-transmission layer;

transferring the crown-shaped pattern of the photoresist layer onto the first conductive layer to form a crown-shaped conductive layer;

forming a dielectric film on the crown-shaped conductive layer; and forming a second conductive layer on the dielectric film.

2. The method of claim 1, wherein the dielectric layer includes a $SiO_2$ layer.

3. The method of claim 1, wherein the step of forming the dielectric layer includes a chemical vapor deposition process.

4. The method of claim 1, wherein the step of forming the contact hole includes an anisotropic etching process.

5. The method of claim 4, wherein the anisotropic etching process uses a fluoric gas as an etching gas source.

6. The method of claim 1, wherein the non-transmission layer includes a chromium layer.

7. The method of claim 1, wherein the partial transmission layer includes a chromium oxide layer.

8. The method of claim 1, wherein the first conductive layer includes a polysilicon layer.

9. The method of claim 1, wherein the conductivity of the first conductive layer is improved by implanting a dopant into the first conductive layer.

10. The method of claim 1, wherein the dielectric film includes a $SiO_2$ layer.

11. The method of claim 1, wherein the dielectric film includes a silicon nitride/silicon oxide layer.

12. The method of claim 1, wherein the dielectric film includes a silicon oxide/silicon nitride/silicon oxide layer.

13. The method of claim 1, wherein the dielectric film includes a $Ta_2O_5$ layer.

14. The method of claim 1, wherein the dielectric film includes a $Pb(Zr, Ti)O_3$ layer.

15. The method of claim 1, wherein the dielectric film includes a $(Ba,Sr)TiO_3$ layer.

16. The method of claim 1, wherein the second conductive layer includes a polysilicon layer.

17. The method of claim 1, wherein the conductivity of the second conductive layer is improved by implanting a dopant into the second conductive layer.

18. The method of claim 1, wherein the first conductive layer is a lower electrode of the capacitor.

19. The method of claim 1, wherein the second conductive layer is an upper electrode of the capacitor.

20. A method for fabricating a crown-shaped capacitor comprising the steps of:

providing a substrate having a pre-formed field effect transistor, wherein the field effect transistor includes a gate and source/drain regions;

forming a dielectric layer;

defining the dielectric layer to form a contact hole, wherein the contact hole exposes one of the source/drain regions;

forming a first conductive layer in the contact hole and on the dielectric layer;

performing a photolithography operation to form a step-like photoresist layer by employing a mask comprising a transmission layer, a set of multi-step partial transmission layers, and a non-transmission layer;

transferring the pattern on the step-like photoresist layer onto the first conductive layer to form a step-like conductive layer;

forming a dielectric film on the step-like conductive layer; and forming a second conductive layer on the dielectric film.

21. The method of claim 20, wherein the dielectric layer includes a $SiO_2$ layer.

22. The method of claim 20, wherein the step of forming the dielectric layer includes a chemical vapor deposition process.

23. The method of claim 20, wherein the step of forming the contact hole includes an anisotropic etching process.

24. The method of claim 23, wherein the anisotropic etching process uses a fluoric gas as an etching gas source.

25. The method of claim 20, wherein the non-transmission layer includes a chromium layer.

26. The method of claim 20, wherein the set of multi-step partial transmission layers includes a set of multi-step chromium oxide layers.

27. The method of claim 20, wherein the set of multi-step partial transmission layers includes at least two different partial transmission layers.

28. The method of claim 20, wherein the first conductive layer includes a polysilicon layer.

29. The method of claim 20, wherein the conductivity of the first conductive layer is improved by implanting a dopant into the first conductive layer.

30. The method of claim 20, wherein the dielectric film includes a $SiO_2$ layer.

31. The method of claim 20, wherein the dielectric film includes a silicon nitride/silicon oxide layer.

32. The method of claim 20, wherein the dielectric film includes a silicon oxide/silicon nitride/silicon oxide layer.

33. The method of claim 20, wherein the dielectric film includes a $Ta_2O_5$ layer.

34. The method of claim 20, wherein the dielectric film includes a $Pb(Zr, Ti)O_3$ layer.

35. The method of claim 20, wherein the dielectric film includes a $(Ba,Sr)TiO_3$ layer.

36. The method of claim 20, wherein the second conductive layer includes a polysilicon layer.

37. The method of claim 20, wherein the conductivity of the second conductive layer is improved by implanting a dopant into the second conductive layer.

38. The method of claim 20, wherein the first conductive layer is a lower electrode of the capacitor.

39. The method of claim 20, wherein the second conductive layer is an upper electrode of the capacitor.

* * * * *